United States Patent
Myoung et al.

(10) Patent No.: US 8,399,334 B2
(45) Date of Patent: Mar. 19, 2013

(54) METHOD OF MANUFACTURING NANO DEVICE BY ARBITRARILY PRINTING NANOWIRE DEVICES THEREON AND INTERMEDIATE BUILDING BLOCK USEFUL FOR THE METHOD

(75) Inventors: Jae Min Myoung, Goyang-si (KR); Hong Koo Baik, Seoul (KR); Tae Il Lee, Ansan-si (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 141 days.

(21) Appl. No.: 13/015,286

(22) Filed: Jan. 27, 2011

(65) Prior Publication Data
US 2011/0309323 A1  Dec. 22, 2011

(30) Foreign Application Priority Data

Jun. 21, 2010  (KR) ........................ 10-2010-0058380

(51) Int. Cl.
*H01L 29/66* (2006.01)
*H01L 21/20* (2006.01)
*H01L 21/66* (2006.01)
*B82Y 99/00* (2011.01)

(52) U.S. Cl. ........... 438/400; 257/E21.09; 257/E21.529; 257/E29.168; 438/16; 438/5

(58) Field of Classification Search ......... 257/9, E21.09, 257/E21.168; 438/16, 5; 977/762
See application file for complete search history.

(56) References Cited

U.S. PATENT DOCUMENTS

| 7,713,753 | B2* | 5/2010 | Xiao et al. | 438/3 |
| 8,252,164 | B2* | 8/2012 | Martin et al. | 204/622 |
| 2011/0165337 | A1* | 7/2011 | Parce et al. | 427/466 |
| 2011/0248401 | A1* | 10/2011 | Hellstrom et al. | 257/741 |
| 2012/0171103 | A1* | 7/2012 | Zhao et al. | 423/415.1 |

OTHER PUBLICATIONS

STIC Patent Search Report.*
Tae Il Lee, et al., "Programmable Direct-Printing Nanowire Electronic Components", Nano Letters, 2010, pp. 1016-1021, vol. 10.
Guihua Yu, et al., "Large-area blown bubble films of aligned nanowires and carbon nanotubes", Nature Nanotechnology, Jun. 2007, pp. 372-377, vol. 2.

* cited by examiner

*Primary Examiner* — Matthew Landau
*Assistant Examiner* — Edward Chin
(74) *Attorney, Agent, or Firm* — Sughrue Mion, PLLC

(57) ABSTRACT

A method of manufacturing a nano device by directly printing a plurality of NW devices in a desired shape on a predesigned gate substrate. The method includes preparing an NW solution, preparing a building block for performing decaling onto the substrate by carrying an NW device, forming the NW device by connecting electrodes of each of building block units of the building block using NWs by dropping the NW solution between the electrodes and then through dielectrophoresis, visually inspecting the numbers of NW bridges that are formed between the electrodes of each of the building block units through the dielectrophoresis, grouping the building block units according to the numbers, and decaling the NW device formed on each of the building block units onto the gate substrate by bringing the grouped building block units into contact with the predesigned gate substrate and then detaching the grouped building block units.

13 Claims, 16 Drawing Sheets

Purified SiNWs and their diameter distribution

METHOD OF MANUFACTURING NANO DEVICE BY ARBITRARILY PRINTING NANOWIRE DEVICES THEREON AND INTERMEDIATE BUILDING BLOCK USEFUL FOR THE METHOD

CROSS REFERENCE TO RELATED APPLICATION

The present application claims priority from Korean Patent Application Number 10-2010-0058380 filed on Jun. 21, 2010, the entire contents of which application are incorporated herein for all purposes by this reference.

BACKGROUND OF THE INVENTION

1. Field of the Invention

The present invention relates to a method of manufacturing a nano device, and more particularly, to a method of manufacturing a nano device by programmably printing respective nanowire devices constituting the nano device in any intended shape, and an intermediate building block used in the same method.

2. Description of Related Art

One-dimensional nanostructures, including semiconductor nanowires (NWs), nanotubes, and quantum wires, exhibit physical and chemical properties that make them promising building blocks for nanoscale electronic and optoelectronic devices. To realize such applications, the fundamental and economic limitations of conventional lithography-based fabrication methods have to be overcome. For example, when NWs are disposed over a substrate, an electrode material is required to be deposited to a height H greater than the diameter D of the wires (H>D). However, there is a problem in that an unnecessarily large amount of expensive noble metal has to be used if Au is used as an electrode material.

There have been many reports of individual NW devices or arrays of NW devices prepared by NW assembly techniques using dispersion and finding, electric field direction assembly, flow-assisted alignment, selective chemical patterning, and up-to-date Langmuir-Blodgett and blown bubble film techniques (Yu, G.; Cao, A.; Lieber, C. M. *Nat. Nanotechnol.* 2007, 27, 373). However, an attractive building block that can be used for hierarchically assembling functional NW devices, which can be manufactured on an intentionally organized system, i.e. a predesigned gate electrode, is still demanded.

Although it is required to freely or programmably arrange and integrate NW devices in an intended shape on the intentionally organized system, no methods have been developed for such purposes.

In the nano device, NWs are connected between electrodes, and the number of the connected NWs is variable according to the application. For example, if it is assumed that 5 to 7 NWs are required to be connected when 1 mA is required, there are no methods to control such connection. In some cases, a nano device, in which less than 5 NWs or more than 10 NWs are coupled, has to be used. However, there are no methods to solve this problem. In the meantime, when a finished electronic appliance is fabricated, the electronic product must be inspected in order to find defects. However, if one defective device is found, the entire product is treated as defective. Then, the entire electronic product has to be replaced in order to overcome the defect. Although this problem can be overcome if a device that does not satisfy the application of the product is screened before the final electronic product is fabricated, there are still no solutions for this purpose.

The information disclosed in this Background of the Invention section is only for the enhancement of understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a method of integrating NW devices on a predesigned gate electrode, i.e. an intentionally organized system, by programmably patterning the NW devices thereon in an intended shape.

Also provided is a method of manufacturing a nano device that satisfies an intended application by enabling any number of NWs to be connected between two electrodes.

Also provided is an intermediate building block that enables NW devices to be patterned in an intended shape on an intentionally organized system in the process of manufacturing a nano device.

Furthermore, provided is an electronic device including a nano device that is patterned according to an intended purpose.

In an aspect of the present invention, provided is a method of manufacturing a nano device by directly printing a plurality of NW devices in a desired shape on a predesigned gate substrate. The method includes the following steps of: (a) preparing an NW solution; (b) preparing a building block carrying NW devices thereon for performing decaling onto the substrate, wherein the building block includes a substrate and an NW device carrier disposed on the substrate, and is divided into a plurality of building block units, each of the building block units having nano device electrodes; (c) forming NW devices by connecting the electrodes of each of the building block units with NWs by dropping the NW solution between the electrodes of each of the building block units, followed by dielectrophoresis; (d) visually inspecting the numbers of NW bridges that are formed between the electrodes of each of the building block units as a result of the dielectrophoresis, and grouping the building block units according to the numbers; and (e) decaling the NW devices, which are formed on the respective building block units, onto the gate substrate by bringing the grouped building block units into contact with the predesigned gate substrate and then detaching the grouped building block units from the predesigned gate substrate.

In an exemplary embodiment, the NW device carrier of the building block may be made of a material that has poor adhesion to the electrodes formed on each of the building block units.

In an exemplary embodiment, a surface of the NW device carrier, which is in contact with the electrodes, may be hydrophobic surface treated.

In an exemplary embodiment, the electrode may be made of Au, and the NW device carrier may be made of Polydimethylsiloxane (PDMS).

In an exemplary embodiment, the Au electrode may have a thickness approximately ranging from 10 nm to 200 nm.

In an exemplary embodiment, the step (c) may include controlling the number of NWs attached to the electrodes of each of the building block units by controlling a Dielectrophoresis (DEP) process time while performing the DEP process.

In an exemplary embodiment, in the step (c), the DEP process may be performed in the range from 100 Hz to 10 MHz.

In an exemplary embodiment, in the step (c), the DEP process may be performed in the range from 1 kHz to 100 kHz.

In an exemplary embodiment, in the step (d), the inspection of the numbers of the NW bridges and the grouping of the building block units according to the numbers can be performed using an optical microscope having a magnification lens or an optical inspection instrument used in the fabrication of a Liquid Crystal Display (LCD) panel.

In an exemplary embodiment, the predesigned gate substrate may include a substrate, a gate electrode patterned in an intended shape on the substrate, and an upper layer functioning as a dielectric and an adhesive layer.

In an exemplary embodiment, the upper layer may be made of one selected from among poly(vinylphenol)(PVP), $SiO_2$, $Al_2O_3$, ZrO and $HfO_2$.

In an exemplary embodiment of the invention, in the step (e), the NW devices can be decaled while the NW bridges are partially embedded in the upper layer of the gate substrate.

In an exemplary embodiment of the invention, the NW devices decaled onto the gate substrate can have an electrode layer, which comes into conformal contact with the NW bridges, portions of which are embedded in the upper layer, while covering the NW bridges.

In another aspect of the invention, provided is a building block used for manufacturing a nano device by directly printing a plurality of NW devices in a desired shape on a predesigned gate substrate. The building block includes a substrate and an NW device carrier disposed on the substrate, and is divided into a plurality of building block units. Each of the building block units includes a nanowire device having nano device electrodes and NW bridges connecting the electrodes.

In an exemplary embodiment, the NW device carrier of the building block may be made of a material that has poor adhesion to the electrode formed on each of the building block units, and a surface of the NW device carrier, which is in contact with the electrode, may be hydrophobic surface treated.

In an exemplary embodiment, the electrode may be made of Au, and the NW device carrier may be made of PDMS.

In an exemplary embodiment, the NW bridges of the NW devices formed on the respective building block units that constitute the building block may be classified into a plurality of groups according to their number.

In an exemplary embodiment, the numbers of the NW bridges attached to the NW device formed on each of the building block units that constitute the building block may be classified into one group.

In a further aspect of the invention, provided is a Field Effect Transistor (FET). The FET includes a substrate; a gate pattern pre-formed in an intended shape on the substrate; an upper layer serving as a dielectric and an adhesive layer; and a source and a drain. NW devices including electrodes and NW bridges, which connect the electrodes, are printed in a desired shape along the gate pattern. Portions of the NW bridges are embedded in the upper layer, and the electrodes of the NW devices are in conformal contact with the NW bridges, portions of which are embedded in the upper layer, while covering the NW bridges.

As set forth above, the NW devices can be directly printed in a desired shape, i.e. programmably printed, on the intentionally organized system.

According to exemplary embodiments of the invention, the NW devices can be directly printed in an intended shape on the system using the intermediate building block, and thus it is not necessary to deposit an electrode material as in the related art. Accordingly, it is possible to realize a nano device or electronic device that exhibits desired characteristics without using an unnecessarily large amount of the electrode material.

The methods and apparatuses of the present invention have other features and advantages which will be apparent from, or are set forth in more detail in the accompanying drawings, which are incorporated herein, and in the following Detailed Description of the Invention, which together serve to explain certain principles of the present invention.

DETAILED DESCRIPTION OF THE INVENTION

Reference will now be made in detail to various embodiments of the present invention, examples of which are illustrated in the accompanying drawings and described below. It should be understood, however, that the following description is provided by way of example but does not limit the scope of the present invention. Throughout the following description, descriptions of well-known constructions, such as a Dielectrophoresis (DEP) process, its principle, and its technical terminologies, will be omitted. However, a person having ordinary skill in the art will fully understand the characteristic constitutions of the invention from the following description.

Figure 1:
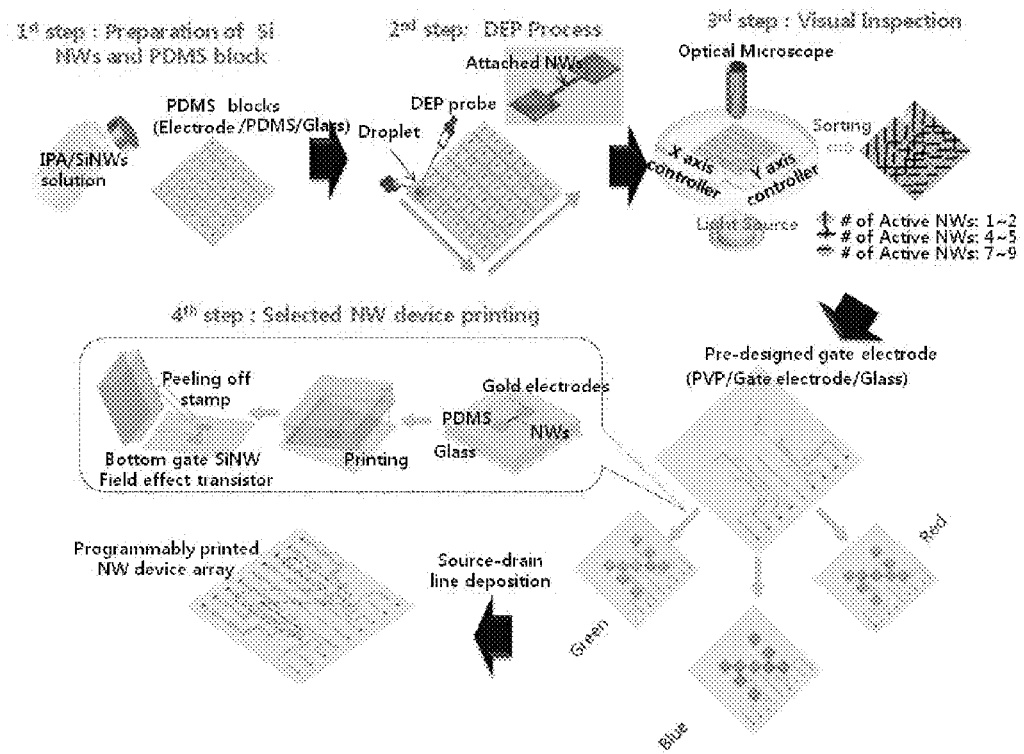
FIG. 1 is a schematic view showing a series of sequences by which a nano device is manufactured by programmably printing NW devices in a desired shape on a predesigned gate substrate according to an exemplary embodiment of the invention.

Referring to FIG. 1, overall sequences of a method of programmably patterning respective NW devices on an intentionally organized system, i.e. printing the NW devices in an intended shape, according to an exemplary embodiment of the invention are shown. As shown in FIG. 1, the method of this embodiment generally includes a first step of preparing NWs and Polydimethylsiloxane (PDMS) blocks; a second step of forming NW devices (each of which consists of electrodes and NWs attached between two electrodes) on respective PDMS blocks by connecting the two electrodes using NWs through a Dielectrophoresis (DEP) process; a third step of sorting the NW devices according to the number of NWs connected between the two electrodes by visually inspecting respective NW devices manufactured in the second step; and a fourth step of manufacturing a nano device by selectively printing the sorted NW devices in a desired shape on a pre-designed gate electrode.

Respective sequences of the steps will be described in greater detail as follows.

A. First Step: Manufacture of Nws and Building Blocks

Figure 2:
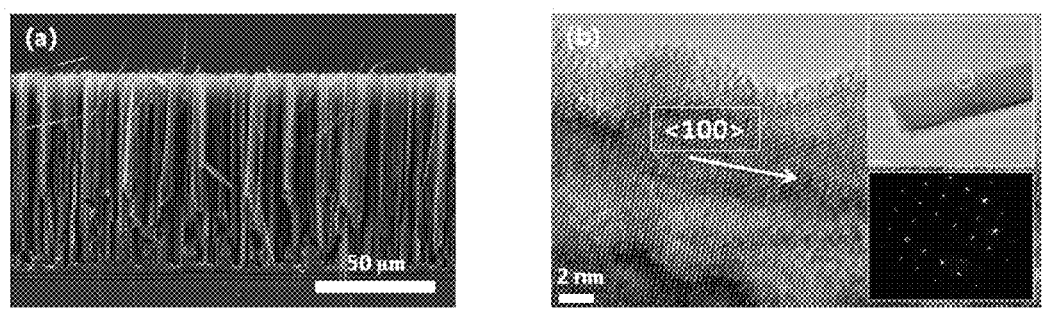
FIG. 2 is an electron microscope picture showing the characteristics of Si NWs formed according to an exemplary embodiment of the invention.

Vertically aligned Si NWs, synthesized using an aqueous chemical-etching technique, are perfect single crystal NWs, as shown in FIG. 2. A commercially available Si wafer (p-type, <100> oriented, 5 to 10 Ωcm) was cut into 1×2 cm pieces, which were in turn cleaned using trichloroethylene, acetone, Isopropyl Alcohol (IPA), and deionized water. Afterwards, the wafer pieces were etched using a 5% HF aqueous solution for 5 minutes at room temperature. The surfaces of the Si wafer pieces were then H-terminated. The Si wafer pieces were immediately dipped into an Ag coating solution containing 10% HF and 0.02 M $AgNO_3$. The solution was slowly stirred for 1 minute in an ambient atmosphere. After an Ag layer was uniformly deposited, the wafer pieces were cleaned with water to remove any extra $Ag^+$, and were then immersed in an etchant composed of 10% HF and 0.6% $H_2O_2$ at 50° C. After 120 minutes of etching in the dark at room temperature, the wafer pieces were cleaned using 10% HF to remove any oxide layer, and were then cleaned with water. Subsequently, the wafer pieces were dried under a 6N-grade $N_2$ flow. Si NW arrays were produced through the foregoing process, and were observed using Scanning Electron Microscope (SEM) (JEOL, JSM-7001F) equipped with Energy-Dispersive X-ray spectroscopy (EDX) and a High-Resolution Transmission Electron Microscope (HRTEM) (JEOL, JEM 2100F). The results are presented in FIG. 2. In FIG. 2 (b), the HRTEM image is magnified from the white circle in the inset bright-field image. From the bright-field image, the noncircular cross section of the Si NWs can be observed. The electro diffraction pattern indicates that the NW is of single crystalline Si.

Figure 3:
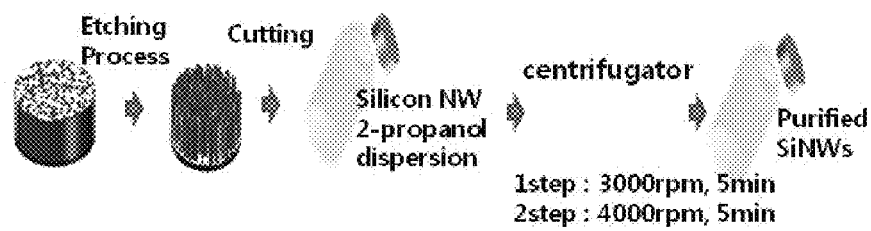
FIG. 3 is a view showing purified Si NWs and the diameter distribution of the purified Si NWs.
Figure 3:
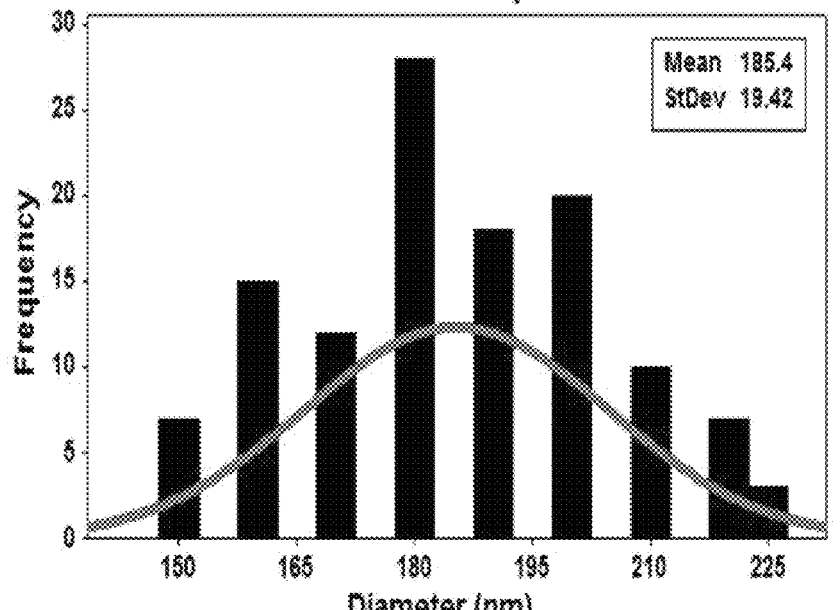
Figure 3:
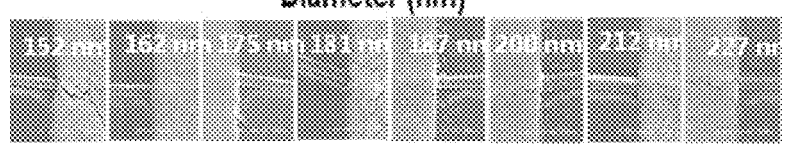

In order to purify the Si NWs synthesized on the mother wafer, the Si NWs were cut, and were then dispersed in IPA using sonication for 5 minutes. Subsequently, the Si NWs were sorted according to their weight by executing a two-step centrifugation method: first at 3000 rpm for 5 minutes and then at 4000 rpm for 5 minutes. As a result, a solution of Si NWs having a diameter of 185±20 nm was obtained. The Si NWs produced through the foregoing process and the diameter distribution of the Si NWs are presented in FIG. 3.

Figure 4:
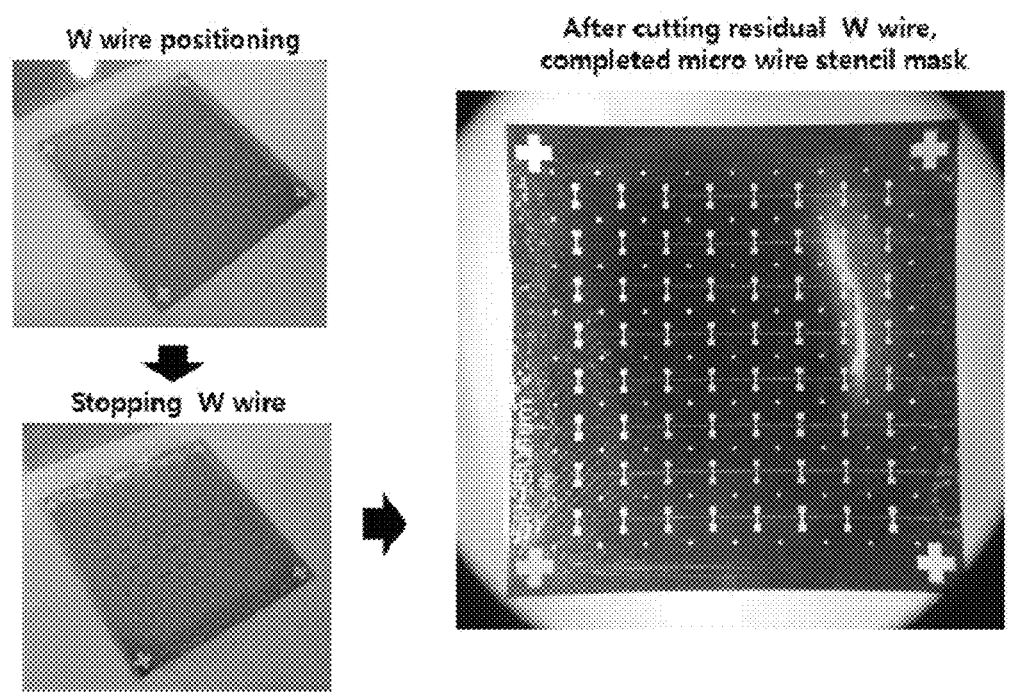
FIG. 4 is a view showing a process of fabricating a tungsten wire stencil mask used for forming gaps between two electrodes formed in a building block.

On a cleaned 1×1 cm glass slide, a 5 mm thick poly(dimethylsiloxane) (PDMS) Dow Corning Silgard 184 layer (comprising a base resin and a curing agent mixed at a 10:1 weight ratio and cured for 4 hours at 80° C.) was formed as a contact printing agent, and was then cut into respective PDMS blocks, as shown in FIG. 1. In order to form electrode gaps on the soft buffer layer (i.e. PDMS layer), an 8 µm tungsten wire stencil was used. Although a mask such as a photomask is used in order to form the electrode gaps, the stencil method was used, since the limit of the electrode gaps that can be formed using the mask is generally 50 µm. More specifically, as shown in FIG. 4, 8 µm tungsten wires were used in order to manufacture a micro-stencil mask. The electrode gap that can be formed using this stencil method is about 10 µm. The tungsten wires were arrayed using a magnifier having 10 power magnification. Afterwards, the tungsten wires were fixed in position using epoxy resin, and the remaining portions of the tungsten wires were cut after minutes, thereby producing a microwire stencil mask. Using this mask, the electrodes were formed on respective PDMS blocks having 10 µm gaps therebetween.

Figure 5:
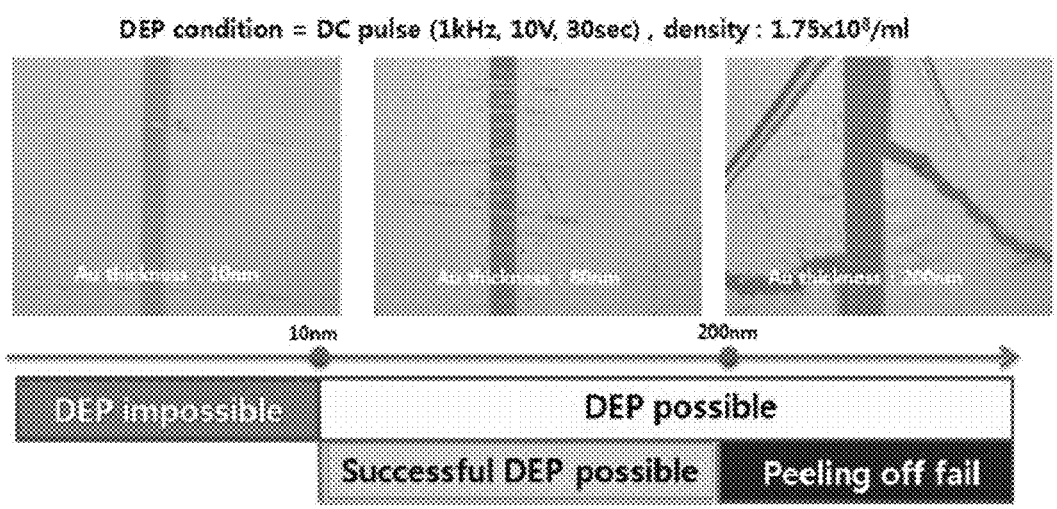
FIG. 5 is a view showing the determination of the optimum thickness of Au for a successful DEP process.

Subsequently, arrays of Au electrodes having gaps of 10 µm therebetween were deposited onto respective blocks of the PDMS surface using a thermal evaporator. In the case of a thin Au layer (<10 nm), the electrical conductivity is not sufficient to generate an electrostatic field at nearby patterned electrodes. Specifically, the NWs are not attached, since an electric field is not properly induced in the following DEP process. In contrast, an Au layer having a thickness of 200 nm or more is peeled off as soon as the DEP solution (IPA) is applied to the electrode pattern. The surface area of the PDMS exhibits a volumetric expansion that induces tensile and compressive stress on the bottom and top surfaces of the Au layer. As a result, the Au layer is distorted with the thickness increasing. Therefore, it was found that the thickness of the Au layer ranges preferably from 10 nm to 200 nm for successful DEP processing (See FIG. 5). In an exemplary embodiment of the invention, the thickness of the Au layers deposited onto the PDMS was about 80 nm at all steps of the DEP process.

B. Second Step: DEP Process

Figure 6A:
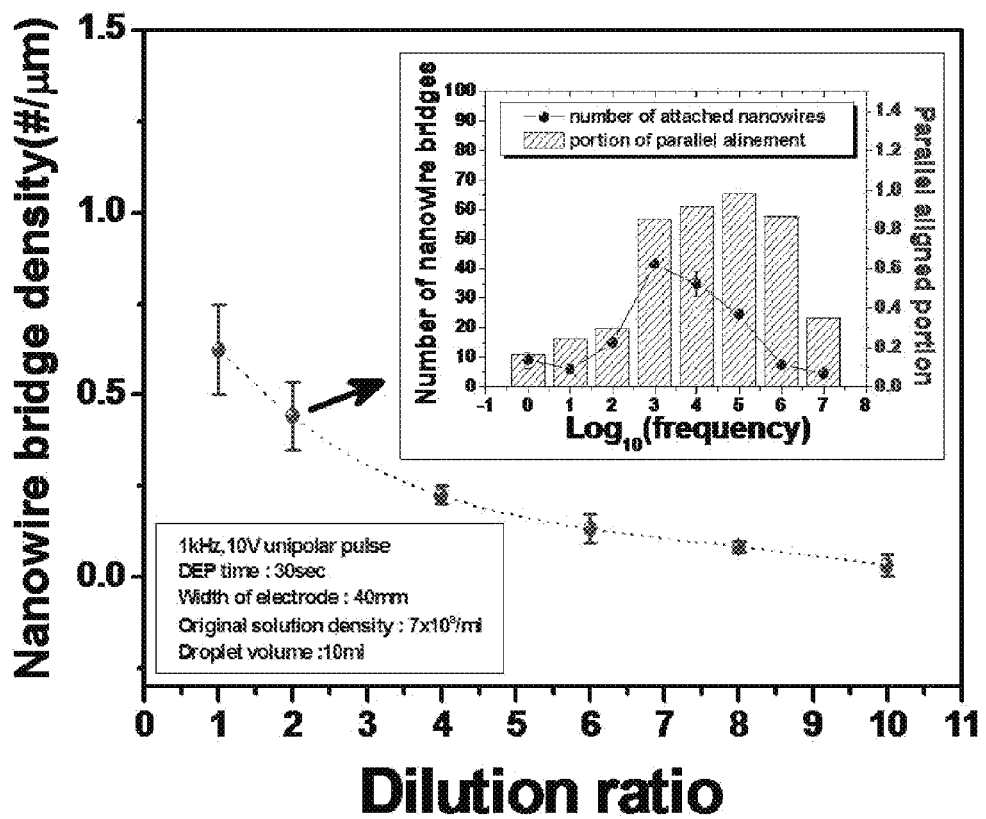
FIG. 6 is a view showing the determination of the optimum condition of the DEP process and the grouping of building block units through the visual sorting of the numbers of NW bridges formed between two electrodes as a result of DEP.
Figure 6B:
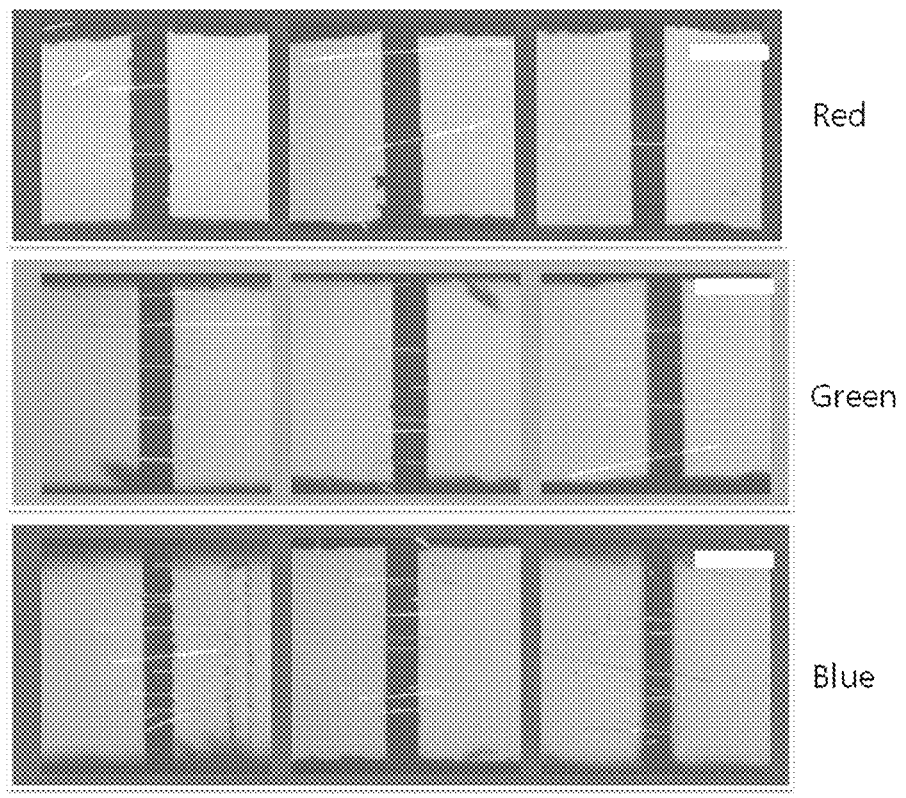

Generally, the DEP process depends on a dielectric medium, NW density, bias on-time, and bias field strength (Pohl, H. A. *Dielectrophoresis; the behavior of neutral matter in non-uniform electric fields,* 1st ed.; Cambridge University Press: Cambridge, U.K., 1978). The inventors performed the DEP process by fixing the DEP medium as IPA for Si NWs at a direct current (DC) bias of 10V. Originally, a dispersion solution prepared using that process has an NW density of about $7×10^8$ NW/mL. As shown in FIG. 6 (a), an increase in dilution ratio results in a reduction in the number of NWs attached between the electrodes, i.e. the number of NWs forming cross bridges per unit of electrode width, in response to the DEP process. In order to determine the optimum DEP condition, the inventors dropped a 10µL droplet of a DEP solution (IPA NW solution) that has been diluted two times onto the electrode gaps using a DEP probe, and then applied 50% DC pulses of various frequencies (from 1 Hz to 10 MHz). The frequency is inversely proportional to the bias time. During this time interval, the NWs are forced toward the electrode gaps between the electrodes in response to the DEP process. Therefore, fast attachment of the NWs at low frequencies can be expected. On the other hand, it is preferred that the NWs be concentrated at the middle of the electrodes in response to an increase in the pulse frequency. A decrease in the on-time of the bias voltage requires more time for the attachment of the NWs onto the electrodes. For frequencies lower than 100 Hz, the inventors observed self-limitation of the NWs against attachment to the electrodes, i.e. the number of attachable NWs was limited by self-repulsion. Below this frequency, the attached NWs experience a bias time that is too long to sustain stable multi-bridge conditions. A long bias time generates excess charge accumulation on the electrodes. When a new NW is attached under these conditions, abruptly accumulated charges are released, and a surge current having reverse polarity is generated from the existing NWs according to Faraday's induction law. Due to this surge current, the NWs that are already attached are detached whenever other NWs are attached. At higher frequencies, the NWs are left enough time to align themselves in the form of the shortest possible bridge, which has the advantage of delivering a carrier between the electrodes. In experiments carried out by the inventors, the frequency of about 100 kHz best satisfied the requirements for this alignment. In consideration of the efficiency of the alignment and attachment, as shown in the inset diagram in FIG. 6 (a), 1 kHz was selected as the best DEP condition. As an additional explanation, "on time" is expressed by the multiplication of frequency and duty. Time control indicates the control of the overall "on time" (the frequency and duty are time concept within one cycle). This means the number of cycles for which the process has been carried out. As shown in FIG. 6 (a), the efficiency of the number of attachments is greatest at a frequency of about 1 kHz, and the degree of alignment of the NWs is best at a frequency of about 100 kHz. Although there is no significant difference in the efficiency of the number of attachments between 1 kHz and 100 kHz in terms of data, the present invention sets 1 kHz, at which the efficiency of the number of attachments was maximized, as the optimum frequency condition. As above, the inventors controlled the number of NWs that were attached to the electrodes by controlling the DEP process time (i.e., frequency). This forms one important characteristic of the invention. As described later, the number of NW bridges connected between the two electrodes is not fixed, and the NW bridges can be sorted according to their number. Accordingly, when the invention is used in a specific application, the number of NW bridges that is optimized to the application can be obtained by determining the number of NWs according to the application.

In the meantime, formation of an intermediate medium, i.e. a building block (a PDMS block in this embodiment) for decaling NW devices onto a gate electrode, which will be described later, through the foregoing process is an important aspect of the invention. In the embodiment shown in FIG. 1, the NW solution was dropped onto each building block using one DEP probe. In this embodiment, however, it is possible to form NW devices on each building block by dropping an NW solution onto a total of 36, i.e. 6×6, building block units through a single operation using a station to which a multi-probe is mounted, and performing a DEP process. Although the number of NWs attached between electrodes, as described later, can be varied by applying various frequencies to the building block consisting of 6×6, i.e. 36, building block units, it is possible to construct the entire building block consisting of the building block units in such a way that the number of attached NWs of an NW device formed on each building block unit belongs to one group (e.g., 4 to 5), by applying a single frequency to the entire building block. As such, the building block including the NW devices that is first proposed in the present invention can conveniently used in nano device applications, since it can be classified as a plurality of groups or a single group according to the application of a nano device.

C. Third Step: Visual Inspection and Classification

Before the fourth step of decaling, which will be described later, each NW bridge between the electrodes was visually inspected using an optical microscope having a 1000 power magnifying lens (Olympus optical microscope, BX41) in order to classify the NW devices according to their channel width. The objective of this process is to determine the number of attached NWs, which represent the channel width of the transistor. In this process, the inventors sorted the PDMS blocks that include Si NW bridges according to the number of attached NWs. Although the number of NWs was discretely counted, this process can be improved using a commercially available optical inspection instrument, which is used in the fabrication of a Liquid Crystal Display (LCD) panel. The inspection results are shown in FIG. 6 (b).

D. Fourth Step: Decaling

The fourth step starts with preparing a pattern having an intended shape in a substrate. First, gate electrodes were patterned in an intended shape on the glass substrate using thermal evaporation. In the present invention, the predesigned gate electrode substrate is referred to as an intentionally organized system.

Subsequently, in order to obtain high printing yield and good device performance, poly(vinylphenol) (PVP) was used not only as a polymeric adhesive agent but also as a dielectric layer. In the present invention, not only PVP but also $SiO_2$, $Al_2O_3$, $ZrO$, $HfO_2$, and the like can be used as the dielectric layer and the adhesive agent. Although the present invention is not specifically limited as to the material of the dielectric layer and the adhesive agent, it is preferable to use PVP. First, a PVP solution (5 wt %) and a cross-linking agent, i.e. poly(melamine-co-formaldehyde) (PMCF), in propylene glycol monomethyl ether acetate (PGMEA) were coated onto the gate-patterned substrate via spin coating. Following the third step of visual inspection, the sorted NW bridges were decaled on the gate dielectric layer on which the 5 wt % PVP solution was coated. Specifically, the NW device formed on each building block can be decaled onto the PVP coating by simply bringing the building block into contact with the PVP coating and then detaching the building block from the PVP coating. Afterwards, the NW bridges were cured at 175° C. for 60 minutes on the N-shaped gate electrode that was patterned on a 3×3 cm glass substrate. Through this processing, each group of Si NW bridges on the PDMS blocks was decaled onto the gate electrode site.

More specifically, as shown in FIG. 1, respective PDMS blocks, formed on the glass slide through the DEP process and consisting of Au electrodes and Si NWs connected therebetween (hereinafter, referred to "NW devices"), are sorted and classified into predetermined groups (three groups in this embodiment) at the third step of visual inspection. Afterwards, the respective PDMS blocks (one PDMS block includes a glass substrate, a PDMS on the glass substrate, Au electrodes on the PDMS, and Si NW bridges between the electrodes) belonging to each group are brought into contact with the gate substrate, so that the electrodes are oriented toward the gate electrodes, and are then detached from the gate substrate. As a result, the electrodes and the NWs, i.e. the NW device, of each PDMS block are printed (i.e. decaled) onto the PVP. In the embodiment shown in FIG. 1, the N-shaped gate electrode pattern was formed by decaling the PDMS blocks that belong to each group 9 times in total. Here, since Au has poor adhesion to the PDMS, the Au electrodes and NWs, i.e. the NW device, is easily peeled off from the PDMS and is then decaled onto the PVP. In order to decal the NW device onto the PVP, no strong adhesion between the electrode and the building block (the PDMS in this embodiment) on which the electrode is formed is required. Therefore, it is preferred that a material, such as PDMS, that has poor adhesion to an electrode be used as the building block, and a material, such as a hydrophobic surface treated plastic film, that is equivalent to the PDMS can be used. Au was used as a material of the electrodes in this embodiment. However, in the case in which the electrodes are made of a material other than Au, it is preferred that the block on which the electrodes are formed be made of a material that has poor adhesion to the electrodes or that the material of the block be hydrophobic surface treated, such that the electrodes can be easily peeled off from the block, whereby the electrodes made of the material other than Au can be easily decaled onto the PVP layer at the fourth step.

Subsequently, after all of the NW devices are decaled along the gate electrode pattern, sources and drains were deposited via thermal evaporation.

Through this process, the nano device consisting of the programmably printed NW devices could be formed. So, it was observed that the nano device can be produced by decaling respective NW devices in a desired shape (i.e., the N shape in this embodiment) onto the substrate, and in particular, arranging the NW devices in a desired shape according to the number of the NWs that are connected between the two electrodes.

E. Characteristic Analysis

Current-voltage data were measured using an Agilent semiconductor parameter analyzer (model 4145B), with contacts to the devices made using a probe station (Desert Cryogenics, model TTP4). The capacitance of the gate dielectric was recorded using a precision LRM meter (model 4284A). The top view image of the device for measuring the active channel width was obtained using an SEM (JEOL, JSM7001F).

Figure 7A:
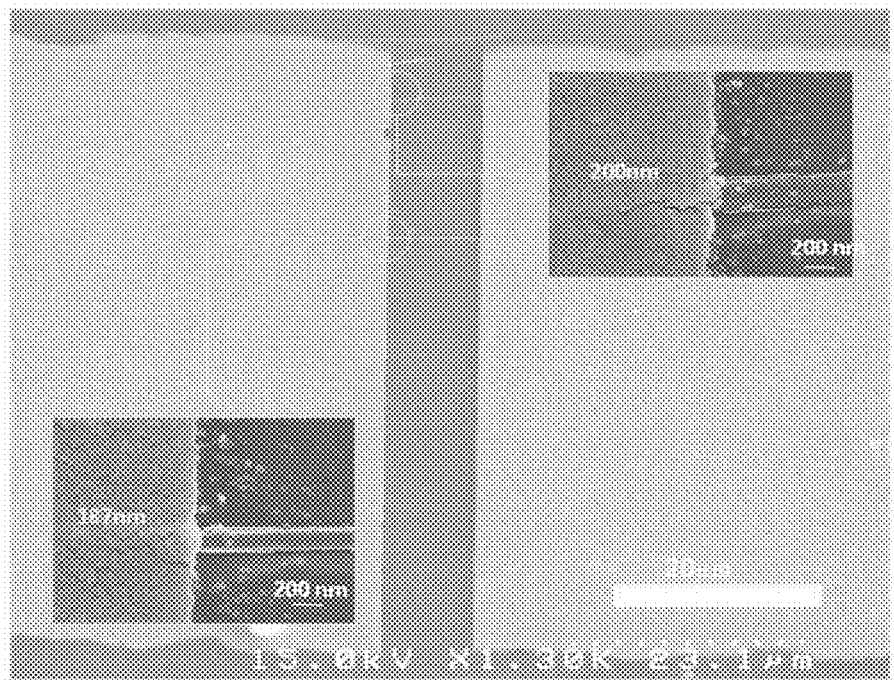
FIG. 7 is a view showing the characteristics of a field-effect Si NW transistor.
Figure 7B:
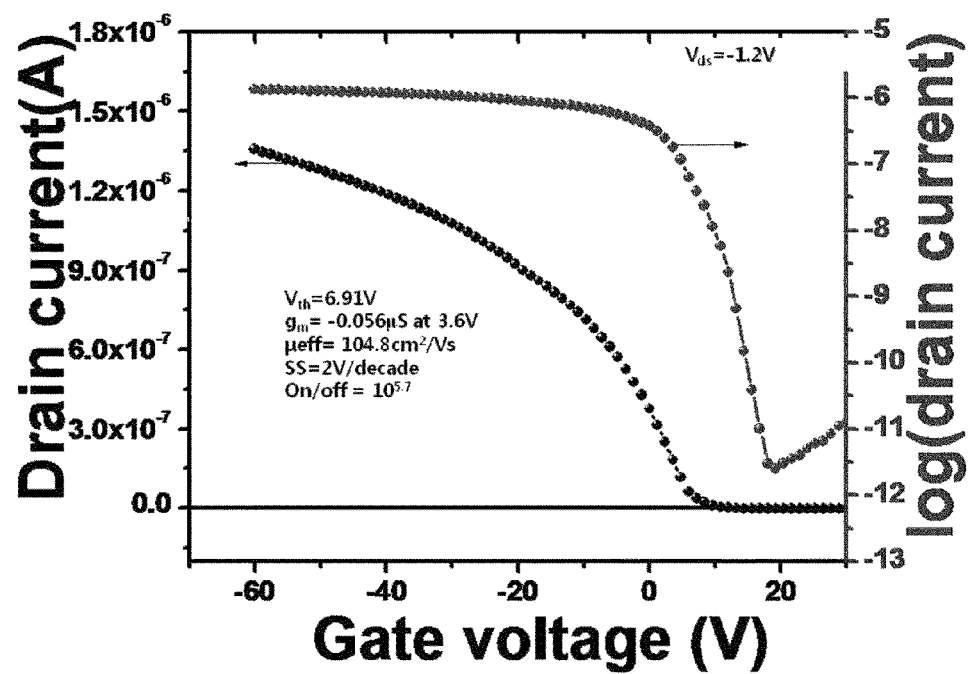
Figure 7C:
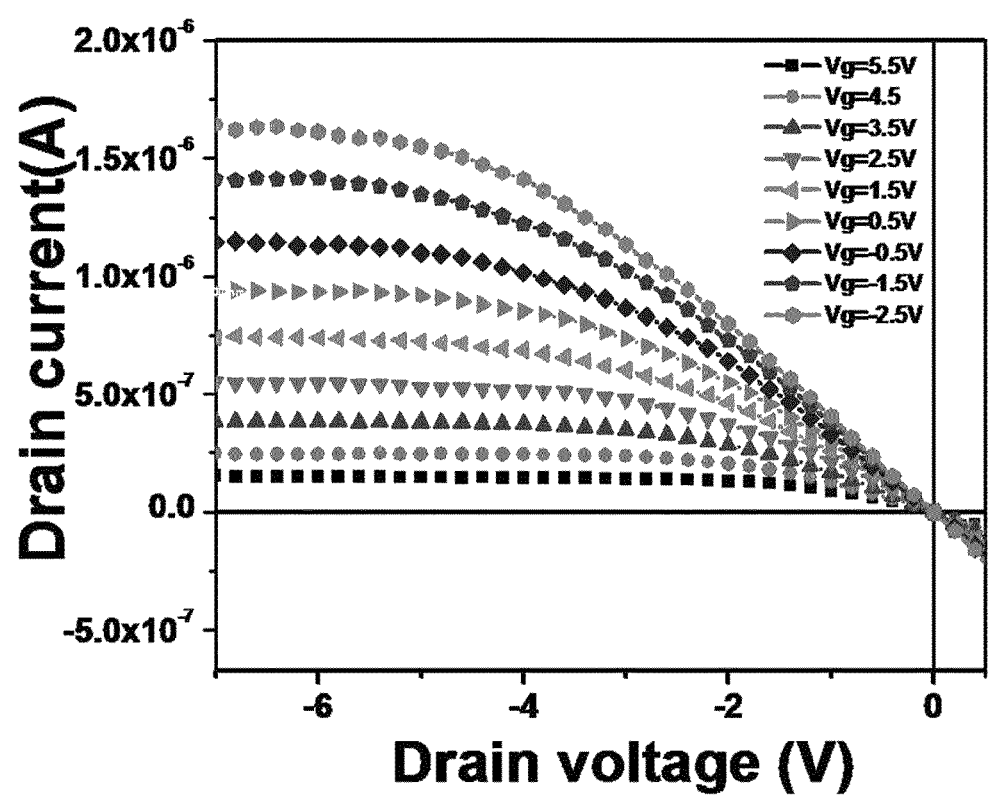
Figure 8:
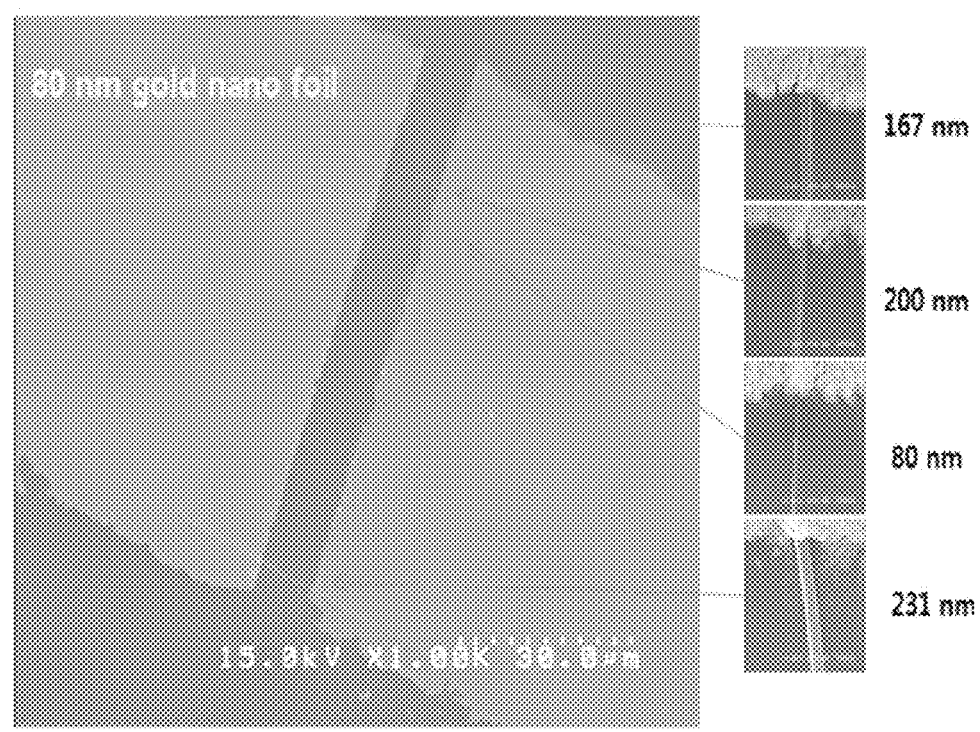
FIG. 8 is an SEM image of an Au nano-foil after decaling, in which an Au nano-foil covers the NWs, portions of the NWs being embedded in a PVP layer after the decaling.

FIG. 7(a) is an SEM image of a nano device consisting of two Si NWs and two electrodes that are decaled, i.e. a field-effect Si NW transistor. The device had a channel length of about 10 μm, and a channel width (a total of the diameters of all NWs) of 387 nm. The transfer characteristics of the device at a $V_{ds}$ (voltage drain to source) of −1.2V were those of a p-channel metal oxide semiconductor, as shown in FIG. 7(b). An on/off ratio of $10^{5.7}$ was obtained, with a subthreshold slope of 2V/decade and a threshold voltage ($V_{th}$) of 6.9V. A transconductance and a normalized transconductance were 0.056 μs and 0.145 μs/μm, respectively. The field-effect mobility p of the device that was calculated is expressed by the formula: $\mu=L/(W\times C_d\times V_{ds})\times gm$, where L is the channel length, W is the channel width of the device, $C_d$ is the capacitance per unit area of the gate dielectric, and $g_m$ is transconductance. The measured value of $C_d$ was 12 nF/cm². The mobility p was then measured to be 104.8 cm²/Vs. FIG. 7(c) shows the output characteristics ($I_{ds}$-$V_{ds}$) of the Si NW transistor as a function of a gate voltage. The output characteristics represent an excellent Ohmic electrical connection attributable to mechanical wrapping contact between the Au foil and the nanoscale semiconductor without conventional heat treatment for the improvement of an electrical connection between a conductor and a semiconductor. The wrapping connection of this embodiment can be more successfully executed on larger NW diameters than can be executed by increasing electrode thickness, because the Au nanofoil on the PDMS freely adjusts its shape on the surface of a target (see FIG. 8). This characteristic will be described in greater detail below with reference to FIG. 9.

Figure 9:
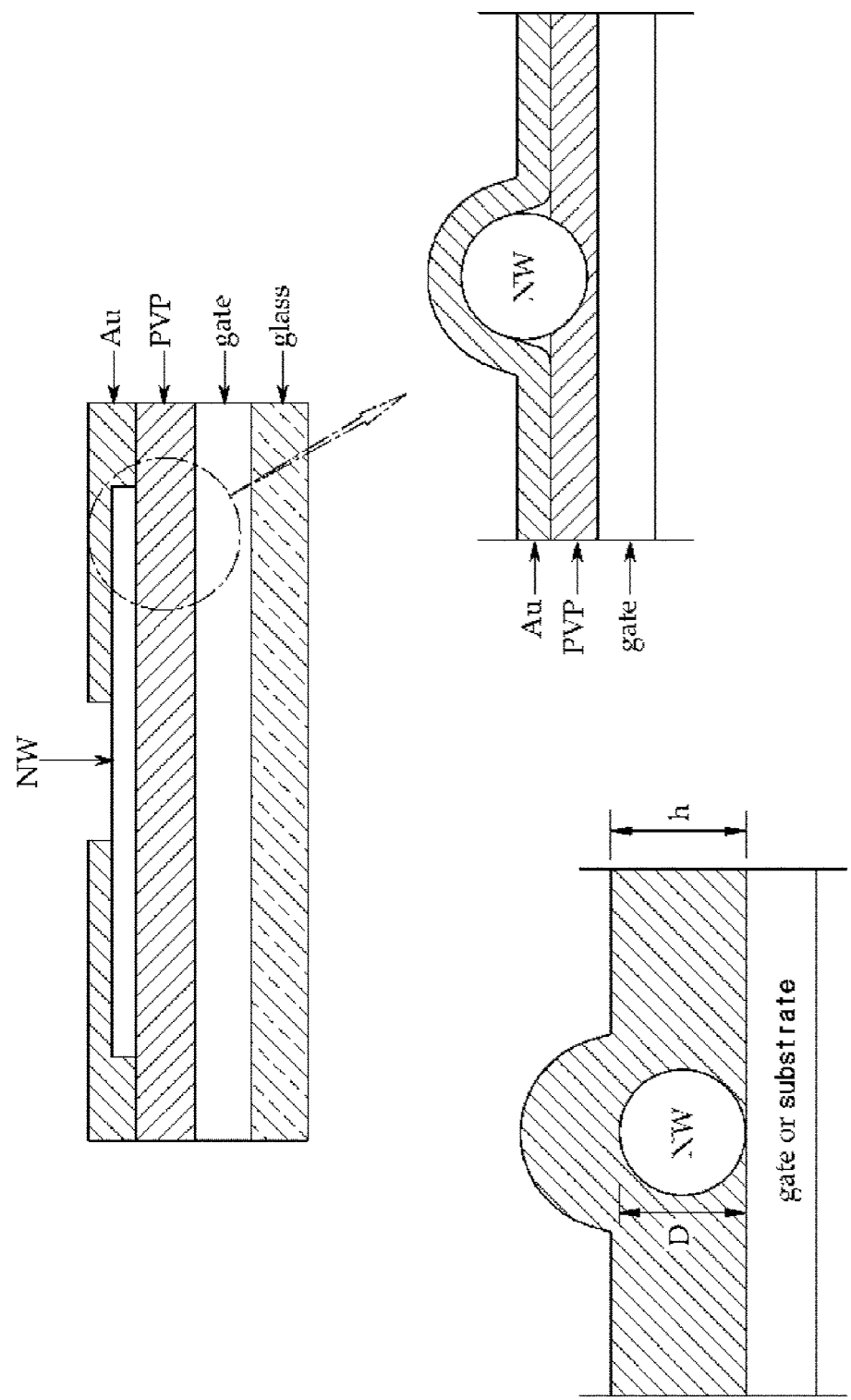
FIG. 9 is a schematic view showing the cross-sectional shapes of a NW device formed according to an exemplary embodiment of the invention and of a NW device of the related art, in which the amount of electrode material can be significantly reduced compared to the related art.

The upper part of FIG. 9 schematically shows the cross-sectional shape in which an NW device is decaled on a pre-designed gate electrode, i.e. a PVP of a PVP-gate electrode-glass substrate array (see FIG. 1), at the fourth step, and the right part of FIG. 9 shows a magnification of a portion of the upper part. Unlike the related art in which an electrode material is formed on a gate electrode through a deposition process, such as vapor-deposition, in the present invention, the NW device formed on the building block, i.e. the PDMS block, is printed onto the gate electrode. Here, portions of the decaled NWs are embedded in the PVP layer (see FIGS. 8 and 9), and the electrode material, i.e. the Au layer, is connected to the NWs through contact in a wrapping mode. That is, the Au layer wraps the NWs along the outline of the NWs, i.e. along the shape of the NWs. (This will be described in greater detail later.) However, as shown in the left part of FIG. 9, in the related art, the NWs are formed on the gate or the substrate, and electrode material (e.g. Au) is vapor-deposited on the NWs. Here, the height h of the electrode material that is deposited is greater than the diameter D of the NR, as in a typical deposition process of a semiconductor process. As will be apparent from the two schematic views, the present invention can remarkably reduce the amount of the material compared to the related art. This difference results from the unique aspect of the invention in which the NW devices (i.e. electrodes-NWs) are formed on the gate electrodes through decaling, i.e. a type of printing, unlike the related art. If the electrode material is selected from noble materials such as Au, this aspect of the invention is further highlighted in terms of cost.

In the decaling, conformal contact is an important factor that leads to high processing yield and good Ohmic contact. First, the NWs on the nano Au foil come into contact with the upper surface of the PVP. This is a starting point of the wrapping (see FIG. 9). Because of low Young's modulus of the PDMS, the Au foil wraps the NWs, and the shape of the foil assumes the outline of the NWs. In the process of an exemplary embodiment of the invention, the uncured PVP layer is plastically deformed using is a rigid mold having a reverse shape of the NW bridges and the electrodes. (This means that, since the PVP can be plastically deformed before being completely cured, if a pressure is applied to the PVP in this state using an object having a specific shape, the reverse image of the shape of the object is printed on the PVP.) As shown in the SEM image (i.e., the inset image in FIG. 7 (a)), the decaled NWs are slightly embedded into the PVP layer. This conformal wrapping ability provides many advantages for a successful electrical connection between the NWs and Au foil, whereby Au atoms easily move and fill valleys present on the surface of the Si NWs. The yield of the decaling (except for DEP) was about 80%. It is believed that high yield of the manufacturing method of the invention is caused by protecting the NWs from many deteriorative circumstances, such as ultraviolet light, photoresistors, e-beam resistors, and resistor removers used in traditional lithography processes, since no such deteriorative circumstances are used.

Figure 10A:
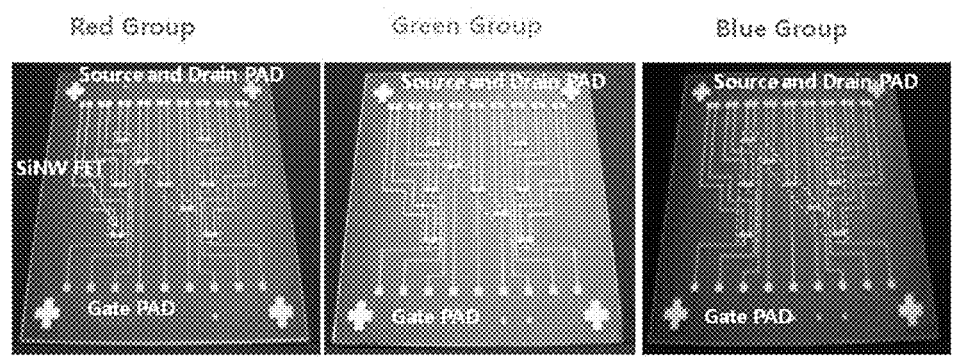
FIG. 10 is a view showing the programmable integration of field-effect Si NW transistors classified according to on-current levels.
Figure 10B:
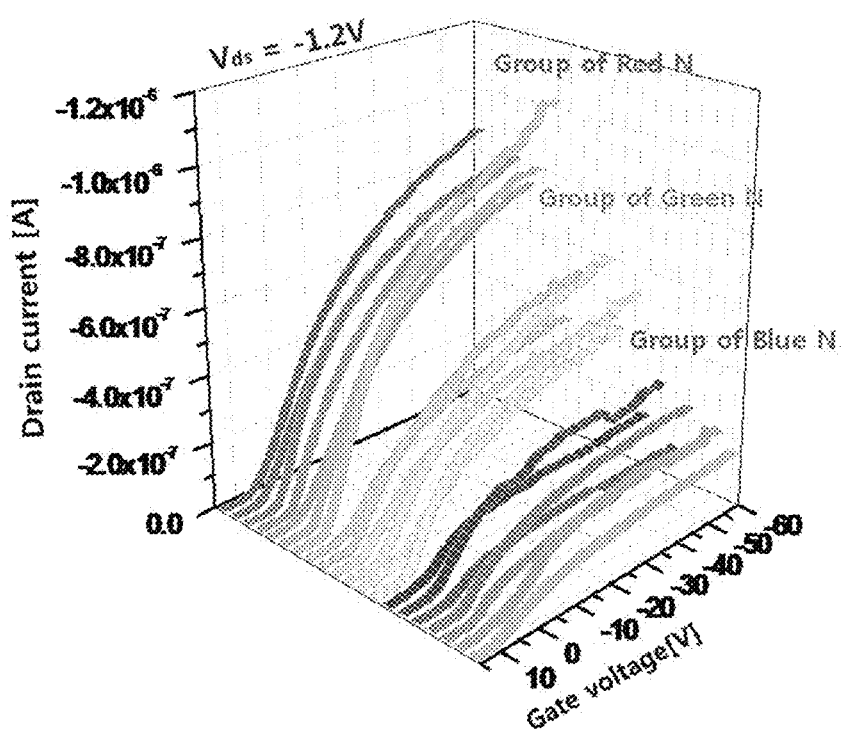
Figure 10C:
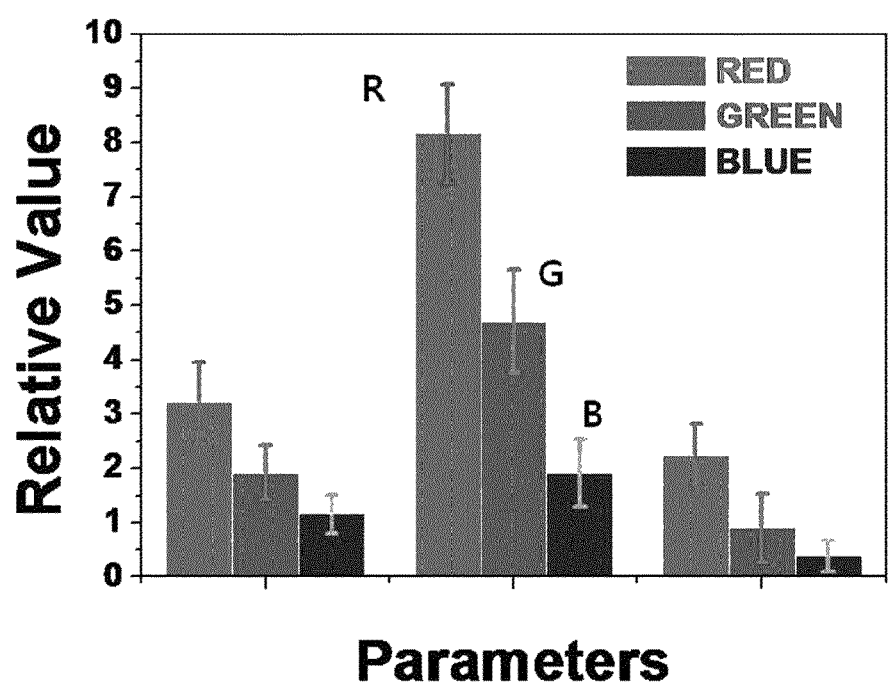
Figure 11:
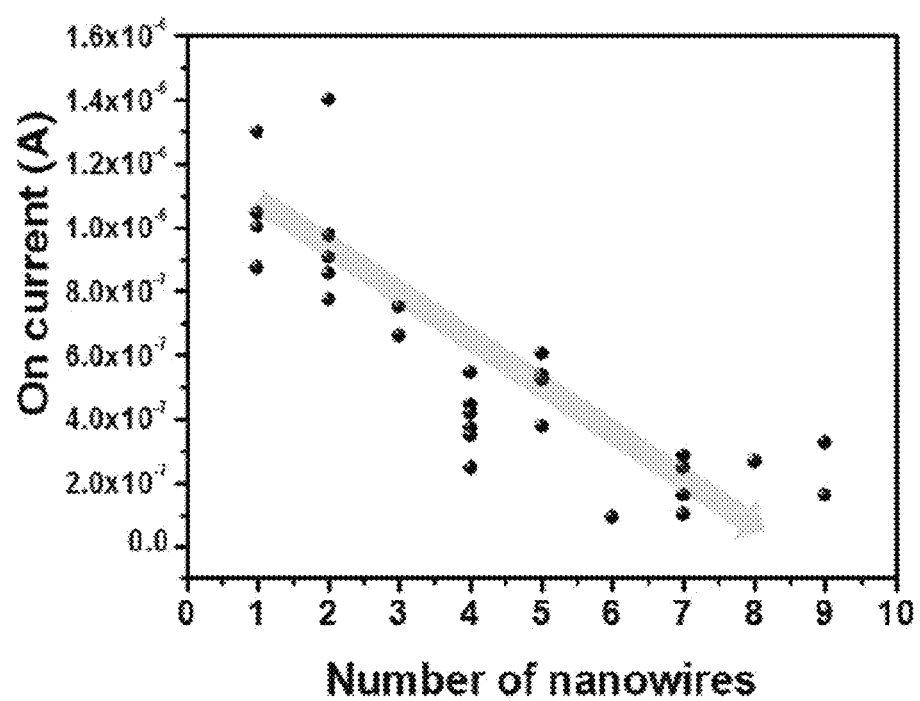
FIG. 11 is a graph showing the inverse proportional between the on-current and the number of NWs.

Furthermore, the highlight of the important aspects of the invention is the programmable fabrication of NW devices having uniform transfer characteristic on an intentionally organized substrate. Regarding recent trend of ink-printing metal-circuitry technology having a high degree of drawing freedom, the manufacturing method according to an exemplary embodiment of the invention opens the possibility of the programmable direct printing of high-performance active electronic devices based on a single crystalline NW semiconductor. At the third step according to an exemplary embodiment of the invention, the three well-classified groups (red, blue, and green groups) of Si NW bridges were individually integrated using programmable decaling on a predesigned PVP-gate electrode-substrate array in the shape of the letter N, as shown in FIG. 10 (a) after being spin coated with 5 wt % PVP. The transfer characteristics of Si NW transistors that are programmably integrated in a desired shape on the gate electrode depend on the number of attached NWs (see FIG. 10 (b)). These transistors are similar to each other in terms of on-current level. From FIG. 10 (c), there were some deviations in performance that came from deviations in the diameter of the NWs. (FIG. 10 (b) shows the transfer characteristics of transistors representing the characteristics of the devices, which are well sorted according to their group, and FIG. 10 (c) shows the sorting result of devices about parameters expected from the transfer characteristics. These experimentally prove the advantages of the invention in that the NW devices can be deposited by being sorted.) That is, the standard deviation was about 20 nm (see FIG. 3). However, the trend of the transfer characteristics among the three groups is different from general trends pertaining to an increase in channel width and an increase in on-current. As the number of NWs increases, the on-current level decreases (see FIG. 11). Although the mechanism of this reverse tendency is still unclear, it is suggested that many of the NWs made a poor electrical connection between the Au nanofoils during printing. Therefore, it is believed that the proper spacing of the NWs has to be determined such that it can avoid this poor connection. Other parameters, such as transconductance and on/off ratio, of the device exhibit the same trend in the on-current characteristics among the three groups (see FIG. 10(c)).

As described above, the present invention discloses the programmable integration method (i.e. the method of integrating an NW device in a desired shape) for the fabrication of field-effect Si NW transistors that have a uniform transfer characteristic (i.e., the variation is small even when several transistors are integrated) on intentionally organized gate sites. After the optimized DEP process for automatic electrode addressing (attachment of NWs between electrodes) and through the preliminary visual inspection of the number of the NWs as the channel width of the transistor, the inventors were able to classify the PDMS blocks, which include NW bridges between the electrodes, into three groups. Because the Si NW bridges, namely active parts of the NW transistor, on the PDMS blocks are fabricated independently from the gate system of the transistor, it is possible to selectively classify the NW devices according to the number of NWs through visual inspection before integration. Therefore, the NW devices can be freely used according to the application. Using the programmable decaling on the predesigned gate sites by performing the printing and integration while drawing the N letter, which is proposed as an example in an exemplary embodiment, 9 NW bridges in each group were individually converted into bottom-gate field-effect Si NW transistors having uniform transfer characteristics (fabrication yield of about 80%). The remarkable aspects of the invention include automatic addressing, by which the NWs are attached to the electrodes without using a lithography process, the preliminary inspection of the active parts of the device according to the number of NWs between the two electrodes, and the programmable integration of the devices. If combined with an inkjet printing circuit during fabrication, the directly printable integration of the single crystalline nanoscale semiconductor components will achieve a significant advance in full-printing electronic technology. According to the above-described method of the present invention, next generation semiconductor electronics can be fabricated to realize a System-On-a-Chip (SOC) consisting of multi-functional heterogeneous NW semiconductor devices, such as NW energy harvesters, NW optoelectronic lasers, NW biosensors, and NW logic gates.

The foregoing descriptions of specific exemplary embodiments of the present invention have been presented for the purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

The invention claimed is:

1. A method of manufacturing a nano device by directly printing a plurality of nanowire (NW) devices in a desired shape on a predesigned gate substrate, the method comprising the following steps of:
   (a) preparing an NW solution;
   (b) preparing a building block for carrying NW devices thereon for performing decaling onto the substrate, wherein the building block includes a substrate and an NW device carrier disposed on the substrate, and is divided into a plurality of building block units, each of the building block units having nano device electrodes;
   (c) forming NW devices by connecting the electrodes of each of the building block units with NWs by dropping the NW solution between the electrodes of each of the building block units, followed by dielectrophoresis;
   (d) visually inspecting the numbers of NW bridges that are formed between the electrodes of each of the building block units as a result of the dielectrophoresis, and grouping the building block units according to the numbers; and
   (e) decaling the NW devices, which are formed on the respective building block units, onto the predesigned gate substrate by bringing the grouped building block units into contact with the predesigned gate substrate and then detaching the grouped building block units from the predesigned gate substrate.

2. The method according to claim 1, wherein the NW device carrier of the building block is made of a material that has poor adhesion to the electrodes formed on each of the building block units.

3. The method according to claim 2, wherein a surface of the NW device carrier, which is in contact with the electrodes, is hydrophobic surface treated.

4. The method according to claim 2, wherein the electrode is made of Au and the NW device carrier is made of polydimethylsiloxane.

5. The method according to claim 4, wherein the Au electrode has a thickness approximately ranging from 10 nm to 200 nm.

6. The method according to claim 1, wherein the step (c) comprises controlling the number of NWs attached to the electrodes of each of the building block units by controlling a dielectrophoresis process time while performing the dielectrophoresis process.

7. The method according to claim 6, wherein in the step (c), the dielectrophoresis process is performed in the range from about 100 Hz to about 10 MHz.

8. The method according to claim 7, wherein in the step (c), the dielectrophoresis process is performed in the range from about 1 kHz to 100 kHz.

9. The method according to claim 6, wherein in the step (d), the inspection of the numbers of the NW bridges and the grouping of the building block units according to the numbers is performed using an optical microscope having a magnification lens or an optical inspection instrument used in the fabrication of a liquid crystal display panel.

10. The method according to claim 6, wherein the predesigned gate substrate comprises a substrate, a gate electrode patterned in an intended shape on the substrate, and an upper layer functioning as a dielectric and an adhesive layer.

11. The method according to claim 10, wherein the upper layer is made of poly(vinylphenol), $SiO_2$, $Al_2O_3$, $ZrO$ or $HfO_2$.

12. The method according to claim 11, wherein in the step (e), the NW devices are decaled while the NW bridges are partially embedded in the upper layer of the gate substrate.

13. The method according to claim 12, wherein the NW devices decaled onto the gate substrate have an electrode layer, which comes into conformal contact with the NW bridges, portions of which are embedded in the upper layer, while covering the NW bridges.

* * * * *